(12) United States Patent
Mouli

(10) Patent No.: US 7,335,958 B2
(45) Date of Patent: Feb. 26, 2008

(54) TAILORING GATE WORK-FUNCTION IN IMAGE SENSORS

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/602,716

(22) Filed: Jun. 25, 2003

(65) Prior Publication Data

US 2004/0262651 A1 Dec. 30, 2004

(51) Int. Cl.
*H01L 31/113* (2006.01)

(52) U.S. Cl. .................... 257/407; 257/E27.13; 438/48

(58) Field of Classification Search ........ 257/290–294, 257/407, 461, 249, 416, E27.13; 438/48
See application file for complete search history.

(56) References Cited

U.S. PATENT DOCUMENTS

| 6,198,087 | B1 * | 3/2001 | Boon ....................... 250/208.1 |
| 6,768,149 | B1 * | 7/2004 | Mann et al. ................. 257/292 |
| 2002/0190287 | A1 | 12/2002 | Mann et al. |

FOREIGN PATENT DOCUMENTS

EP 0 798 785 10/1997

JP 01-232765 9/1989

OTHER PUBLICATIONS

Y.V.Ponomarev et al., Gate-Workfunction Engineering Using Poly-(Si,Ge) for High-Performance 0.18 um CMOS Technology, 1997 IEDM.*
Kim, K.T. et al.—"Tungsten Silicide/Titanium Nitride Compound Gate," Jun. 4, 1990, Symposium on VLSI Technology, Honolulu, Jun. 4-7, 1990, New York, IEEE, US, pp. 115-116.
Long, Wei et al.—"Dual-Material Gate (DMG) Field Effect Transistor," May 1999, IEEE Transactions on Electron Devices, IEEE Inc. New York, US, pp. 865-870.
Ponomarev, Y.V. et al.—"Gate-Workfunction Engineering Using Poly-(Si,Ge) for High-Performance 0.18 μm CMOS Technology," International Electron Devices Meeting 1997, IEDM Technical Digest, Washington, DC, Dec. 7-10, 1997, New York, NY, IEEE, US, Dec. 7, 1997, pp. 829-832.

(Continued)

*Primary Examiner*—Lynne Gurley
*Assistant Examiner*—Colleen Matthews
(74) *Attorney, Agent, or Firm*—Dickstein Shapiro LLP

(57) ABSTRACT

Embodiments of the invention provide a method of forming a pixel cell and the resultant pixel cell a photo-conversion device formed at a surface of a substrate and a transistor adjacent to the photo-conversion device. The transistor comprises a gate overlying a channel region. The gate comprises at least one gate region having a work-function greater than a work-function of n+ polysilicon. The channel region comprises respective portions below each gate region. A dopant concentration in at least one portion of the channel region is determined at least in part by the work-function of the respective gate region.

75 Claims, 10 Drawing Sheets

OTHER PUBLICATIONS

Yagishita, Atsushi et al.—"Dynamic Threshold Voltage Damascene Metal Gate MOSFET (DT-DMG-MOS) Technology for Very Low Voltage Operation of Under 0.7 V," IEEE Transactions on Electron Devices, IEEE Inc. New York, US, vol. 49, No. 3, Mar. 2002, pp. 422-428.

Internationsl Search Report dated Nov. 30, 2004.

Nadia Lifshitz—"Dependence of the Work-Function Difference Between the Polysilicon Gate and Silicon Substrate on the Doping Level in Polysilicon," IEEE Transactions on Electron Devices, vol. Ed-32, No. 3, Mar. 1985.

Tsu-Jae King et al.—"Electrical Properties of Heavily Doped Polycrystalline Silicon-Germanium Films," IEEE Transactions on Electron Devices, vol. 41, No. 2, Feb. 1994.

Sunetra Mendis et al.—"CMOS Active Pixel Image Sensor," IEEE Transactions on Electron Devices, vol. 41, No. 3, Mar. 1994.

R. H. Nixon et al.—"256×256 CMOS Active Pixel Sensor Camera-on-a-Chip," IEEE Journal of Solid-State Circuits, vol. 31, No. 12, Dec. 1996.

Baohong Cheng et al., "The Impact of High-κ Gate Dielectrics and Metal Gate Electrodes on Sub-100 nm MOSFET's," IEEE Transactions on Electron Devices, vol. 46, No. 7, Jul. 1999, pp. 1537-1544.

* cited by examiner

TAILORING GATE WORK-FUNCTION IN IMAGE SENSORS

FIELD OF THE INVENTION

The present invention relates to the field of semiconductor devices, particularly to an improved pixel cell for high efficiency charge transfer and reduced lag.

BACKGROUND OF THE INVENTION

Complimentary metal oxide semiconductor (CMOS) image sensors are increasingly being used as low cost imaging devices. A CMOS image sensor circuit includes a focal plane array of pixel cells. Each one of the cells includes a photo-conversion device, such as a photogate, photoconductor, or photodiode, overlying a charge accumulation region within a substrate for accumulating photo-generated charge. Each pixel cell may include a transistor for transferring charge from the charge accumulation region to a sensing node, and a transistor, for resetting the sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of photo-generated charge; (3) transfer of charge to the sensing node accompanied by charge amplification; (4) resetting the sensing node to a known state before a transfer of charge to it; (5) selection of a pixel for readout; and (6) output and amplification of a signal representing pixel charge from the sensing node. Photo-generated charge may be amplified when it moves from the initial charge accumulation region to the floating diffusion node. The charge at the sensing node is typically converted to a pixel output voltage by a source follower output transistor.

CMOS image sensors of the type discussed above are generally known and are discussed in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe operation of conventional CMOS image sensors, the contents of which are incorporated herein by reference.

A schematic top view of a portion of a semiconductor wafer fragment containing a conventional CMOS pixel cell is shown in FIG. 1. The CMOS pixel cell 10 is a four transistor (4T) cell. The pixel cell 10 generally comprises a photo-conversion device 21 for collecting charges generated by light incident on the pixel, and a transfer gate 7 for transferring photoelectric charges from the photo-conversion device 21 to a sensing node 4, typically a floating diffusion region 4. The floating diffusion region 4 is electrically connected to the gate of an output source follower transistor 11. The pixel cell 10 also includes a reset transistor 9 for resetting the floating diffusion region 4 to a predetermined voltage before a photoelectric charges are transferred; a source follower transistor 11 which receives at its gate an electrical signal representative of the photoelectric charges from the floating diffusion region 4; and a row select transistor 13 for outputting a signal from the source follower transistor 11 to an output terminal in response to an address signal.

FIG. 2 is a diagrammatic side sectional view of the pixel cell 10 of FIG. 1 taken along line 2-2'. As shown in FIG. 2, in the conventional CMOS pixel cell 10 the photo-conversion device 21 is a pinned photodiode. The pinned photodiode 21 has a photosensitive p-n-p junction region comprising a p-type surface layer 5 and an n-type photodiode region 14 within a p-type active layer 1, which is typically a lightly doped p-active area. Adjacent to the pinned photodiode 21 is a gate 7 of a transfer transistor. Typically, the transfer gate 7 is an n+ gate having a gate electrode 8 comprising a layer of heavily doped n-type polysilicon.

In the conventional CMOS pixel cell 10 depicted in FIGS. 1 and 2, charge in the form of electrons is generated by light incident externally to the pixel cell 10 and stored in the n-type photodiode region 14. This charge is transferred to the floating diffusion region 4 by the gate 7 of the transfer transistor. The source follower transistor 11 produces an output signal from the transferred charges. The output signal is proportional to the charge, or number of electrons, extracted from the n-type photodiode region 14.

Optimizing the characteristics of a transfer gate device is critical to providing a high performance CMOS image sensor. Ideally, a transfer gate should have very low leakage in the off state, a low threshold voltage, and no potential barriers that impede the flow of electrons in a region 30 where a photo-conversion device, such as the pinned photodiode 21, and transfer gate are in close proximity to one another. These characteristics can often conflict with one another and optimizing them is difficult.

In a conventional CMOS pixel cell having a photo-conversion device, such as pinned photodiode 21, a potential barrier might exist where the transfer gate 7 and pinned photodiode 21 are in close proximity: the photodiode/transfer gate region 30. FIG. 3 is a graph representing the potential (V) in the pixel cell 10 along the distance (D) of line 3-3' (FIG. 2) in a direction from the pinned photodiode 21 to the transfer gate 7 and the floating diffusion region 4 of the CMOS pixel cell 10. The potential profile of FIG. 3 shows the potentials that an electron may encounter, including a potential barrier 31, as it is transferred from the pinned photodiode 21 to the floating diffusion region 4.

As shown in FIG. 3, there is a potential barrier 31 corresponding to the photodiode/transfer gate region 30. If this potential barrier is too high, a portion of the charge will be unable to move from the photodiode 21 to the floating diffusion region 4. The greater the potential barrier, the less charge will be transferred to the floating diffusion region 4. This potential barrier is influenced by the characteristics of the pixel cell 10, including: 1) p-type dopant levels in the channel region of the transfer gate 7; 2) dopant levels in the transfer gate 7 channel region used to adjust the threshold voltage; 3) transfer gate 7 oxide thickness; 4) pinned photodiode 21 surface p-type dopant levels; 5) pinned photodiode 21 n-type dopant levels; and 6) any background p-type dopant concentration.

The existence of a potential barrier in the photodiode/transfer gate region 30 is a significant problem in CMOS image sensors. A potential barrier in the photodiode/transfer gate region 30 causes incomplete charge transfer reducing the charge transfer efficiency of the pixel cell 10. Further, charge remaining in the photodiode 21 can affect charge collected for a subsequent image causing image lag, where a ghost image from the initial charge is apparent in a subsequent image. Previous methods to reduce this potential barrier have resulted in degraded sub-threshold leakage current for the transfer gate 7. It is difficult to optimize both the potential barrier and sub-threshold leakage current for the transfer gate 7 in CMOS image sensors. Accordingly, what is desired is a technique for manufacturing a CMOS pixel cell having both a reduced potential barrier in an area where a photodiode and a transfer gate structure are in close proximity to one another and also with low sub-threshold leakage characteristics.

BRIEF SUMMARY OF THE INVENTION

Embodiments of the invention address the problems described above and provide a method of forming a pixel cell and the resultant pixel cell. A pixel cell comprises a photo-conversion device formed at a surface of a substrate and a transistor adjacent to the photo-conversion device. The transistor comprises a gate overlying a channel region. The gate comprises at least one gate region having a work-function greater than a work-function of n+ polysilicon. The channel region comprises respective portions below each gate region. A dopant concentration in at least one portion of the channel region is determined at least in part by the work-function of the respective gate region. Tailoring the gate work-function using an alternative material and/or dopant characteristics for the at least one gate region allow the gate and its operation to be modulated and optimized. Specifically, a desired threshold voltage may be achieved with reduced or omitted channel doping, thereby helping both to reduce a potential barrier in region where a photodiode and transfer gate are in close proximity to one another and to provide superior sub-threshold leakage characteristics for the gate.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

Figure 1:
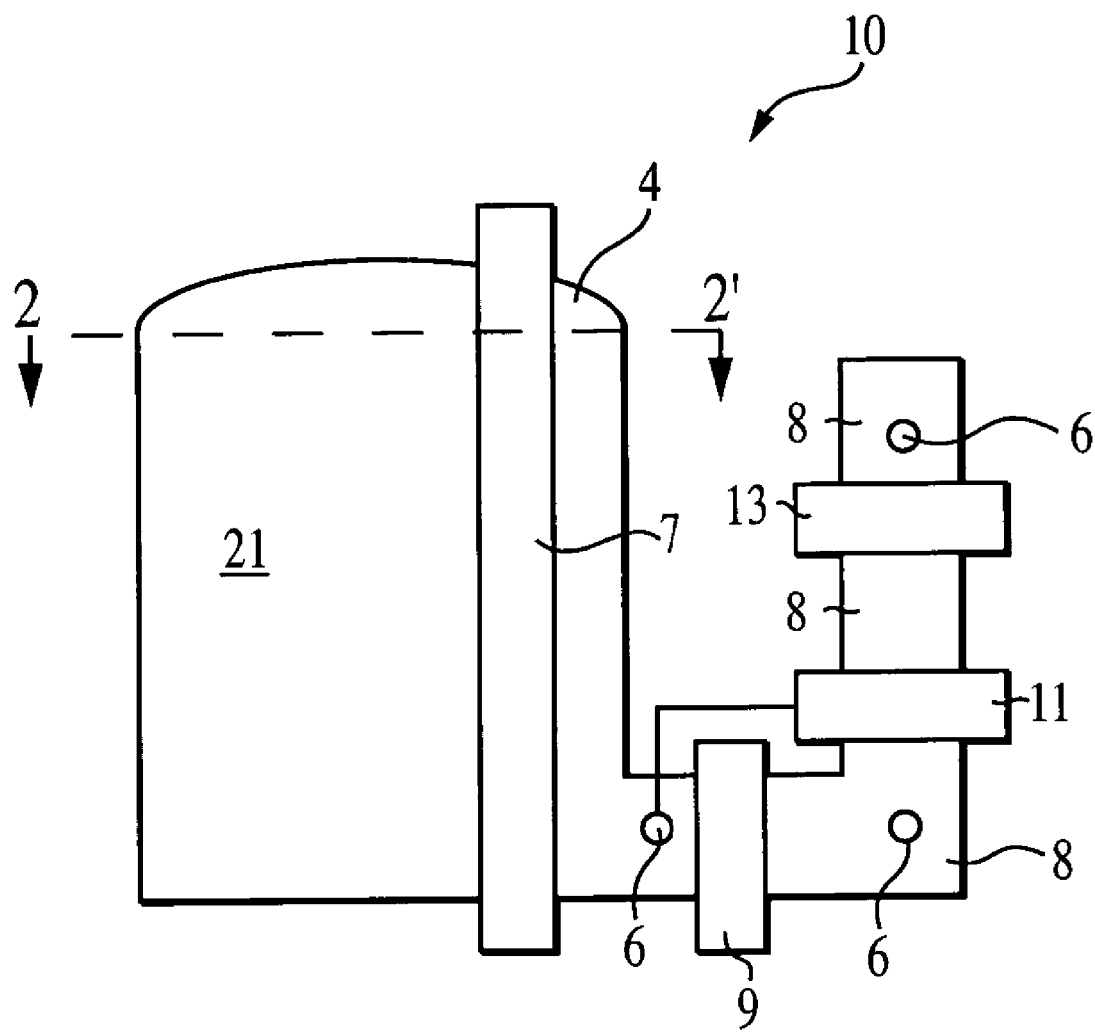
FIG. 1 is a top plan view of a conventional CMOS pixel cell.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photo-conversion device and transistors for converting electromagnetic radiation to an electrical signal. For purposes of illustration, a representative pixel is illustrated in the figures and description herein, and typically fabrication of all pixels in an image sensor will proceed simultaneously in a similar fashion.

Figure 2:
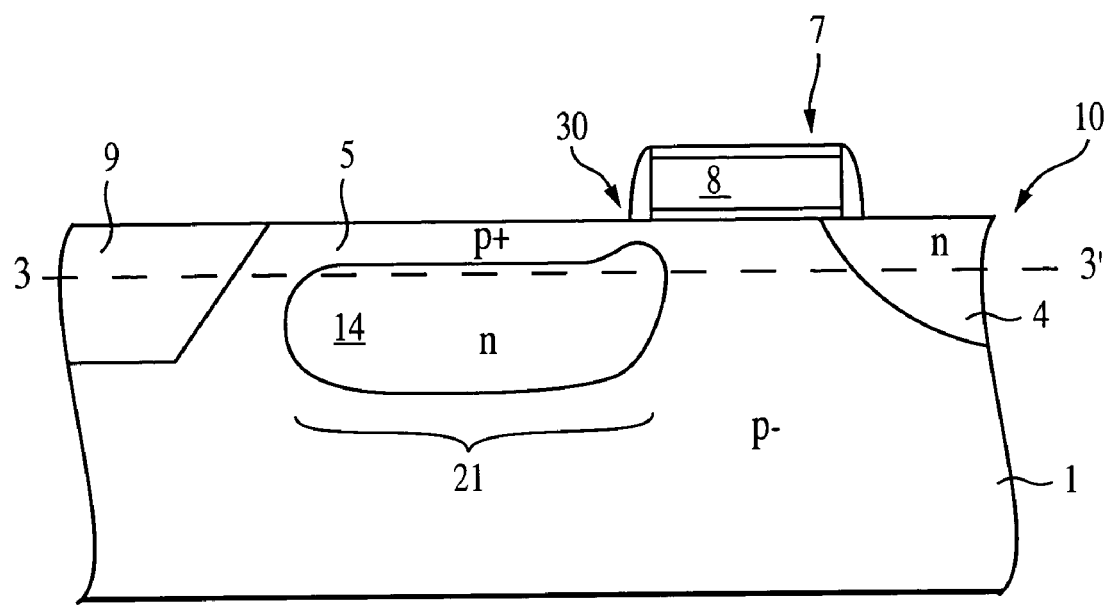
FIG. 2 is a diagrammatic side sectional view of the FIG. 1 pixel cell taken along line 2-2'.
Figure 3:
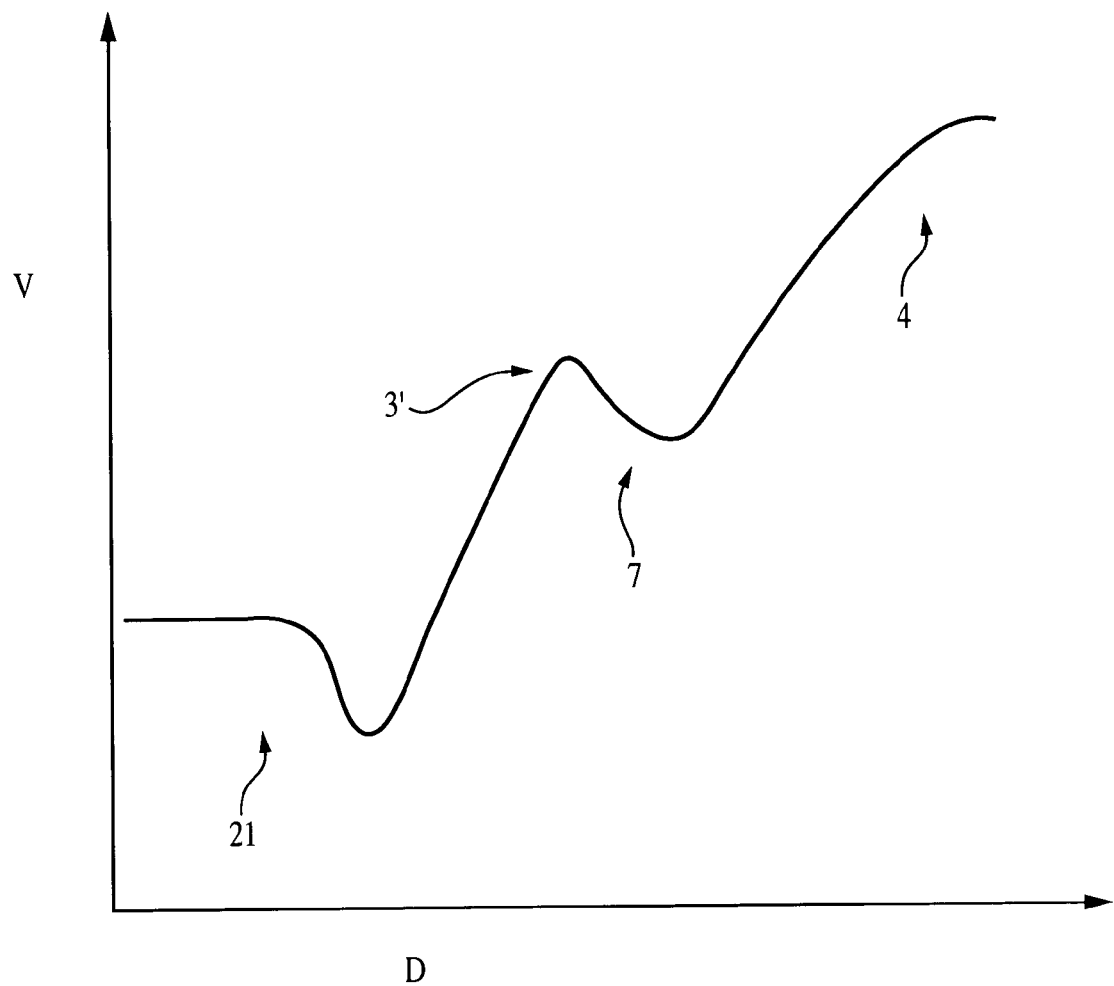
FIG. 3 is a graph representing the potential profile of the FIG. 2 pixel cell along a cut-line 3-3'.

Embodiments of the invention provide a method of forming a pixel cell for an image sensor and the resultant device. The pixel cell includes a photo-conversion device adjacent to a gate of a transfer transistor, which comprises a gate electrode. According to embodiments of the invention, the work-function of the transfer gate is tailored such that at a given threshold voltage, $V_t$, the dopant concentration in a channel region of the transfer gate is reduced or eliminated as compared to a conventional pixel cell 10 (FIGS. 1 and 2). Additionally, embodiments of the invention provide a transfer gate having a gate electrode comprising a plurality of regions having differently tailored work-functions.

The terms of the threshold voltage ($V_t$) equation include: the Fermi potential ($2\Phi_F$), the bulk charge ($Q_B$), the oxide charge ($Q_{ox}$), the normalized gate dielectric capacitance ($C_{OX}$), and the work-function difference ($\Phi_{MS}$). The equation for $V_t$ can be written as follows:

$$V_t = +|2\Phi_F| + |Q_B/C_{OX}| - |Q_{OX}/C_{OX}| + \Phi_{MS}$$

The Fermi potential ($2\Phi_F$) is dependent on channel doping and increases with increased doping. The bulk charge ($Q_B$) behaves the same way, but in a square root relationship. $C_{OX}$ is the normalized gate dielectric capacitance and increases as the gate dielectric thickness is reduced. The oxide charge ($Q_{ox}$) is a function of gate dielectric processing and includes a fixed and interface charge. The work-function difference ($\Phi_{MS}$) is defined as the difference in the work-functions of the gate material ($\Phi_M$) and the substrate ($\Phi_S$). The work-function difference is dependent on the material of the gate electrode and is weakly dependent on the Fermi level of the substrate.

The work-function of the gate electrode is a characteristic property of the material itself, and is the amount of energy, usually expressed in electron volts, required to remove an electron from the Fermi level of the material. The work-function of a gate electrode is important for its effect on the threshold voltage for a transistor. For example, there can be over a one-volt difference in the work-function between the gate electrodes of n+ polysilicon and p+ polysilicon.

Figure 4:
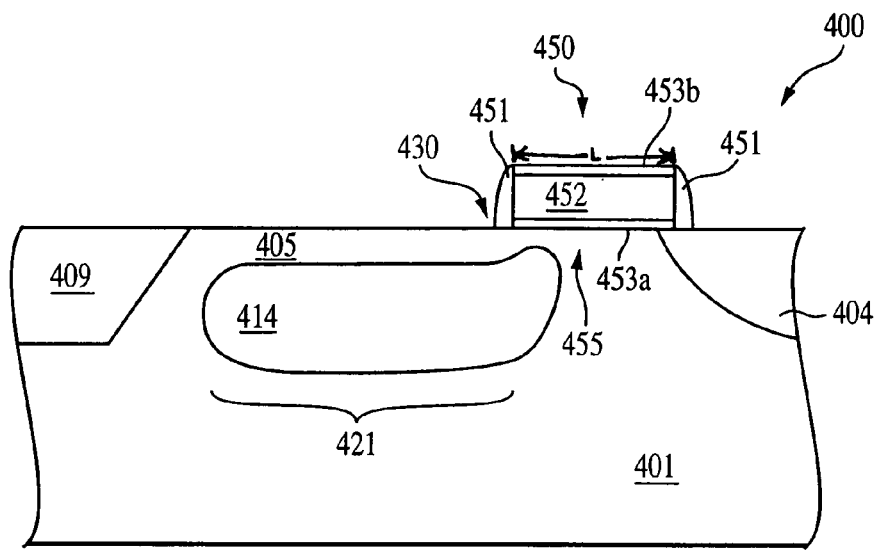
FIG. 4 is a diagrammatic side sectional view of a pixel cell according to an exemplary embodiment of the invention.

Referring now to the drawings, where like elements are designated by like reference numerals, FIG. 4 shows an exemplary pixel cell 400 according to a first exemplary embodiment of the present invention.

FIG. 4 illustrates an isolation region 409 in a substrate 401. There is also a gate structure 450 of a transfer transistor. The gate 450 includes a first layer of insulating material 453a over the substrate 401, a gate electrode 452 over the first insulating layer 453a, and a second insulating layer 453b over the gate electrode 452. On two lateral opposing sides of the stack of layers 453a, 452, and 453b, are side wall spacers 451.

Adjacent to the gate 450 is a photo-conversion device, which for exemplary purposes is a pinned photodiode 421. The pinned photodiode 421 has a surface layer 405 of a first conductivity type overlying a region 414 of a second conductivity type within the substrate 401. Also adjacent to the gate 450, but on an opposite side to the pinned photodiode 421, is a sensing node, which, for exemplary purposes, is a floating diffusion region 404.

The gate electrode 452 has a length L extending from the pinned photodiode 421 to the floating diffusion region 404, which serves as a source/drain region for the transfer transistor. In a first exemplary embodiment of the invention, the transfer gate electrode 452 work-function is tailored by forming the transfer gate 450 comprising a layer of doped or undoped mid-gap material. Mid-gap materials are those materials having a work-function falling between the work-functions of p+ silicon (Si) and n+ Si or, otherwise stated, between the conduction band and valence band of Si. Mid-gap materials may be comprised of two or more constituent materials. Examples of such materials include $Si_{1-x}Ge_x$, TiN/W, Al/TiN, Ti/TiN, and TaSiN which are commonly used in semiconductor devices. Altering the mole fraction of the constituent material alloys in a mid-gap material alters the work-function of the mid-gap material.

The work-function of the mid-gap material, and therefore the gate electrode 452, is tailored by altering the mole fractions of the constituent materials, such that the work-function of the gate electrode 452 is higher than the work-function of a conventional n+ gate electrode 8 (FIG. 2). At a same threshold voltage, $V_t$, the dopant concentration in the channel region 455 of the transfer gate 450 is determined at least in part by the work-function of the gate electrode 452 and is lower than in a conventional pixel cell 10 (FIGS. 1 and 2), or may be eliminated.

The lower dopant concentration of the channel region serves to reduce a potential barrier in a photodiode/transfer gate region 430 where the transfer gate 450 and the pinned photodiode 421 are in close proximity and to improve the sub-threshold leakage characteristics of the transfer gate 450.

The formation of the pixel cell 400 shown in FIG. 4 will be described in connection with FIGS. 5A-C below. No particular order is required for any of the actions described herein, except for those logically requiring the results of prior actions. Accordingly, while the actions below are described as being performed in a general order, the order is exemplary only and may be altered.

Figure 5A:
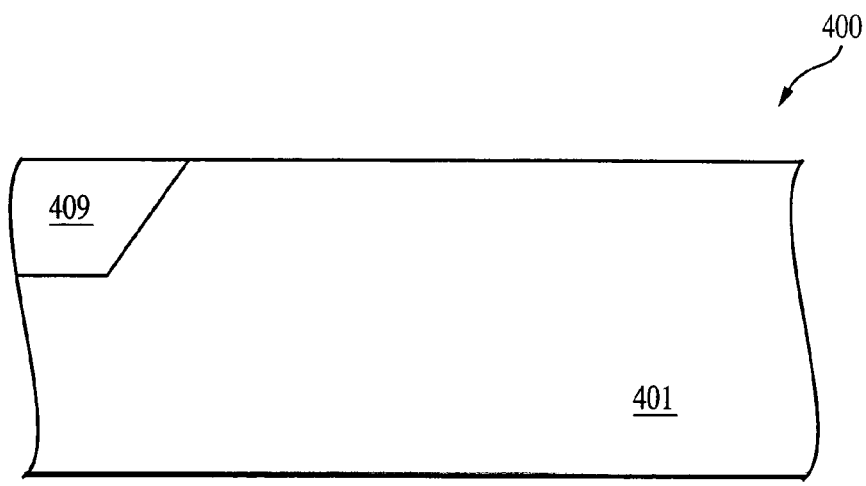
FIG. 5A depicts the FIG. 4 pixel cell at an initial stage of processing.

FIG. 5A depicts an isolation region 409 in a substrate 401. Preferably, the substrate 401 is a p-type silicon substrate 401. The isolation region 409 is formed within the substrate 401 and is filled with a dielectric material, which may include an oxide, such as SiO or $SiO_2$; oxynitride; a nitride, such as silicon nitride; silicon carbide; a high temperature polymer; or other suitable material. Preferably, as in this example, the isolation region is a shallow trench isolation (STI) region 409, formed by known STI processes.

Figure 5B:
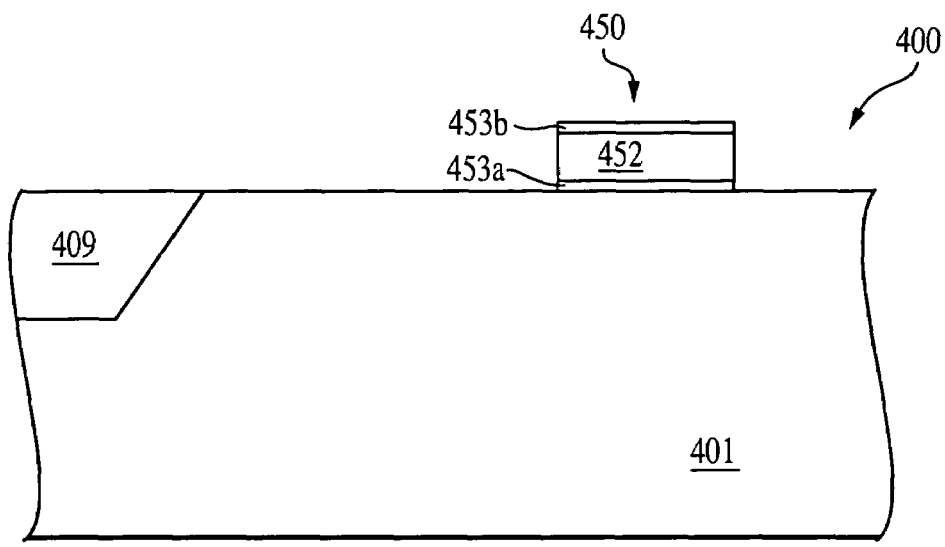
FIG. 5B depicts the FIG. 4 pixel cell at an intermediate stage of processing.

As shown in FIG. 5B, a gate 450 of a transfer transistor is formed over the substrate 401. Preferably, the gate 450 is a multilayer transfer gate stack comprising a first insulating layer 453a of grown or deposited silicon oxide on the substrate 401, a gate electrode 452 comprising a mid-gap material, and a second insulating layer 453b, which may be formed of an oxide ($SiO_2$), a nitride (silicon nitride), an oxynitride (silicon oxynitride), ON (oxide-nitride), NO (nitride-oxide), or ONO (oxide-nitride-oxide). The first and second insulating layers, 453a and 453b, and the gate electrode 452 may be formed by conventional deposition methods, such as chemical vapor deposition (CVD) or plasma chemical vapor deposition (PECVD), among others. The layers 453a, 452, and 453b are patterned to form the multilayer stack structure shown in FIG. 5B.

The mid-gap material forming the gate electrode 452 has a work-function falling between the work-functions of p+ Si and n+ Si. The mid-gap material may be, for example $Si_{1-x}Ge_x$, TiN/W, Al/TiN, Ti/TiN, TaSiN or any other appropriate material. The mole fractions of the constituent materials are selected to achieve a desired work-function. The work function of the mid-gap material at least in part determines the dopant concentration in a channel region 455 (FIG. 4) of the gate 450, such that at a given threshold voltage, the dopant concentration is reduced or eliminated as compared with a conventional pixel cell 10 (FIGS. 1 and 2).

Preferably, the mid-gap material for the gate electrode 452 is a layer 452 of $Si_{1-x}Ge_x$. The mole fractions of Ge and Si are altered to achieve a desired work-function. Increasing the Ge mole fraction decreases the work-function. Preferably, the mole fraction of Ge in the $Si_{1-x}Ge_x$ layer 452 is approximately 0.4.

Also, the $Si_{1-x}Ge_x$ layer 452 may be doped with p-type or n-type dopants. N-type dopants may be phosphorus, arsenic, antimony, or any other appropriate n-type dopant. P-type dopants may be boron, indium, or any other suitable p-type dopant.

As is the case with n+ and p+ silicon, p+ $Si_{1-x}Ge_x$ has a higher work-function than n+ $Si_{1-x}Ge_x$. The work-functions of p+ and n+ $Si_{1-x}Ge_x$ are discussed in King et al., "Electrical Properties of Heavily Doped Polycrystalline Silicon-Germanium Films," IEEE Trans. Elect. Dev. Vol. 2(41) pp. 228-232 (February 1994), which is incorporated herein by reference. As discussed by King et al. and noted above, the work-function of p+ and n+ $Si_{1-x}Ge_x$ decreases as the mole fraction of Ge increases. The mole fraction of Ge in a p+ $Si_{1-x}Ge_x$ layer 452, however, has a greater effect on the work-function difference than in an n+ $Si_{1-x}Ge_x$ layer 452. Therefore, for a same range of mole fractions of Ge, a p+ $Si_{1-x}Ge_x$ layer 452 will have a wider range of corresponding work-functions than will an n+ $Si_{1-x}Ge_x$ layer 452.

Referring to FIG. 5B, the invention is not limited to the structure of the gate 450 as described above. Additional layers may be added or the gate 450 structure may be altered as is desired and known in the art, provided that the work-function of the gate electrode 452 is tailored according to the invention. For example, a silicide layer (not shown) may be formed between the gate electrode 452 and the second insulating layer 453b. The silicide layer may be included in the gate 450, or in all of the transistor gate structures in an image sensor circuit, and may be titanium silicide, tungsten silicide, cobalt silicide, molybdenum silicide, or tantalum silicide. This additional conductive layer may also be a barrier layer/refractor metal, such as TiN/W or W/N$_x$/W, or it could be formed entirely of WN$_x$.

A channel implant may also be conducted to implant a desired dopant in a channel region 455 below where the gate 450 is to be formed. Any suitable known technique may be used to dope channel region 455. Accordingly, channel region 455 may be doped, for example, before or after the gate 450 is fully formed. The channel region 455 may be implanted with a p-type dopant, which may be boron, indium, or any other suitable p-type dopant. As noted above, however, a channel implant may also be eliminated.

Figure 5C:
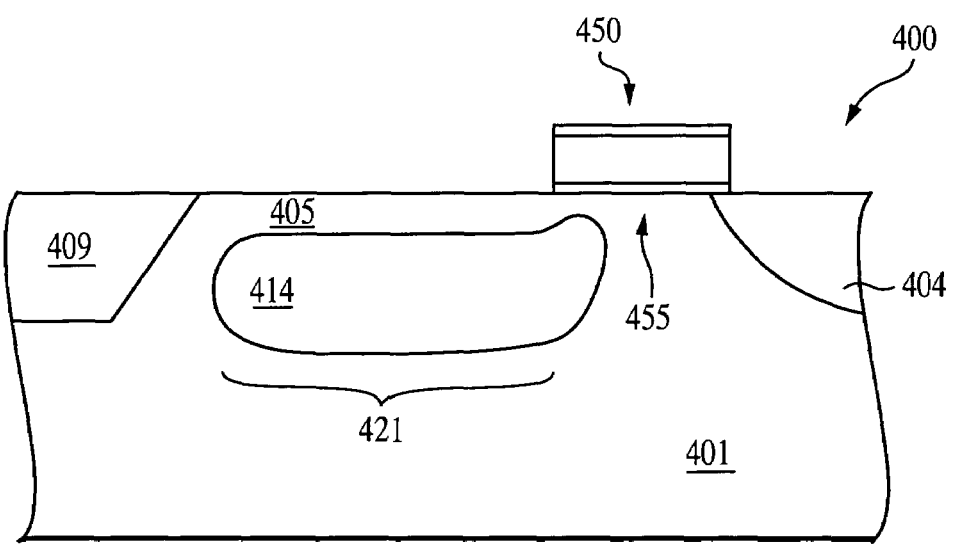
FIG. 5C depicts the FIG. 4 pixel cell at an intermediate stage of processing.

Referring to FIG. 5C, a sensing node 404 is formed adjacent to the gate 450 and on an opposite side of the gate 450 from where the photodiode 421 is to be formed. Preferably, the sensing node 404 is a floating diffusion region 404. The floating diffusion region 404 is formed in the substrate 420 by known methods as a doped region of second conductivity type, which is preferably n-type.

A photo-conversion device is also formed adjacent to the gate 450 on a side opposite to the floating diffusion region 404. Preferably, as is shown in FIG. 5C, the photo-conversion device is a pinned photodiode 421. The pinned photodiode 421 may be formed by methods known in the art. Accordingly, a photodiode region 414 of a second conductivity type is formed in the substrate 401. Preferably, the photodiode region 414 is a lightly doped n-region 414. The n-region 414 is approximately aligned with an edge of the gate 450 and forms a photosensitive charge accumulating region for collecting photo-generated electrons.

A doped surface layer 405 of a first conductivity type is formed over the n-region 414. Preferably, the doped surface layer 405 is a highly doped p+ surface layer 405. The active dopant concentration of the p+ surface layer 405 is preferably within the range of approximately $1 \times 10^{18}$ to $1 \times 10^{19}$ atoms per cm$^3$, and more specifically is approximately $5 \times 10^{18}$ atoms per cm$^3$. Boron is the preferred dopant, but other suitable p-type dopants, such as indium, may be used. Preferably, the p+ surface layer 405 is spaced away from the gate electrode 452 by approximately 800 to 1200 Å.

To complete the structure shown in FIG. 4, sidewall spacers 451 are formed on the sidewalls of the gate 450 by conventional methods. The sidewall spacers 451 may be an appropriate dielectric material, such as silicon dioxide, silicon nitride, an oxynitride, ON, NO, ONO, or TEOS, among others.

Further processing may be employed to form other conventional features of a pixel cell.

A second exemplary embodiment of the invention is described below. The second exemplary embodiment is similar to the first exemplary embodiment described above in connection with FIGS. 4 through 5C, except for the material comprising the gate electrode 452. For simplicity, the second exemplary embodiment is described with reference to FIG. 4 and only the differences with respect to the gate electrode 452 are noted. Also, the formation of a pixel cell 400 according to the second exemplary embodiment is similar to that described above in connection with FIGS. 5A through 5C, except that the gate electrode 452 is formed of a different material. For simplicity, a description of the process is not repeated and only the differences with respect to the gate electrode 452 are noted.

According to the second exemplary embodiment of the invention, the work-function of the transfer gate electrode 452 is tailored by altering the dopant type and/or concentration of the gate electrode 452. The gate electrode 452 is a doped layer of polysilicon 452.

Preferably, the doped layer of polysilicon 452 is a degenerately doped p+ layer 452 having a dopant concentration of greater than or equal to approximately $1 \times 10^{20}$ atoms per cm$^3$. Preferably, the p-type dopant is boron, and the p+ layer 452 is doped using a boron-11 implant, as is known in the art. A p+ gate electrode 452 has a higher work-function than the convention n+ transfer gate electrode 8 of pixel cell 100 (FIG. 2).

The work function of the p+ gate electrode 452 at least in part determines the dopant concentration in a channel region 455 (FIG. 4) of the gate 450, such that at a given threshold voltage, the dopant concentration is reduced or eliminated as compared a conventional pixel cell 10 (FIGS. 1 and 2). The lower dopant concentration in the channel region of the transfer gate 450 serves to reduce a potential barrier in the photodiode/transfer gate region 430 and to improve the sub-threshold leakage characteristics of the transfer gate 450.

Alternatively, the doped layer of polysilicon 452 may be a lower doped p-type or n-type polysilicon layer 452. For purposes of this specification, the term "lower doped" refers to a dopant concentration that is below a concentration of a heavily doped p+ or n+ region. Accordingly, lower doped polysilicon has a work-function between that of n+ and p+ polysilicon. At a given threshold voltage, a gate 450 comprising a lower doped polysilicon gate electrode 452 having a work-function between the work-functions of p+ Si and n+ Si. The work-function of the lower doped polysilicon layer 452, and thus the gate 450 work-function, is tailored by changing the dopant type and concentration. The dependence of work-function on n-type dopant concentrations in a polysilicon gate is discussed by Lifshitz, "Dependence of the Work-Function Difference Between the Polysilicon Gate and Silicon Substrate on the Doping Level in the Polysilicon," IEEE Trans. Elect. Dev. Vol. ED-32(3) pp. 617-621 (March 1985), which is incorporated herein by reference.

A lower doped n-type gate electrode 452 may be doped with phosphorus, arsenic, antimony, or any other appropriate n-type dopant. Preferably, however, the lower doped gate electrode 452 is a p-type gate electrode 452 and a p-type dopant is used, such as boron, indium, or any other suitable p-type dopant.

The lower doped gate electrode 452 may be formed using conventional techniques. For example, a dopant resulting in poor activation, such as indium, may be used. Also, a polysilicon layer 452 that is of one conductivity type may be subsequently counter doped with a dopant of a different conductivity type to achieve the desired active dopant concentration.

The work function of the lower doped gate electrode 452 at least in part determines the dopant concentration in a channel region 455 (FIG. 4) of the gate 450, such that at a given threshold voltage, the dopant concentration is reduced or eliminated as compared with a conventional pixel cell 10 (FIGS. 1 and 2). The reduced dopant concentration in the channel region 455 serves to reduce a potential barrier in the photodiode/transfer gate region 430 and improve charge transfer from the photodiode 421 to the floating diffusion region 404.

Lowering the active dopant concentration in the polysilicon layer 452 will also lead to depletion of the polysilicon layer 452. Depletion of the polysilicon layer 452 occurs near an interface with the oxide layer 453a which separates the polysilicon layer 452 from the substrate 401. The thickness of the depletion region plus the thickness of the oxide layer 453a yields an increased thickness in the total effective oxide layer.

In additional exemplary embodiments of the invention, a pixel cell may have a gate structure that includes two or more regions having differently tailored work-functions. Two such exemplary embodiments are described below in connection with FIGS. 6A-7B. A gate structure having a plurality of gate regions may be generally formed as described above in connection with FIGS. 5A-5C, except that operations can be performed separately on each region. Additionally, the gate structure's channel region can also be differently doped under each gate region.

The gate regions may be formed of different materials, or a same material that is doped to create regions having different work-functions. For example, one gate region may be formed of $Si_{1-x}Ge_x$ and another may be formed of p+ polysilicon; or one gate region may be formed of p+ $Si_{1-x}Ge_x$ and another one gate electrode may be formed of n+ $Si_{1-x}Ge_x$. It should also be noted that one or more of the gate regions may be formed of n+ polysilicon. Additionally, the channel region may have different dopant concentrations under each gate region.

Figure 6A:
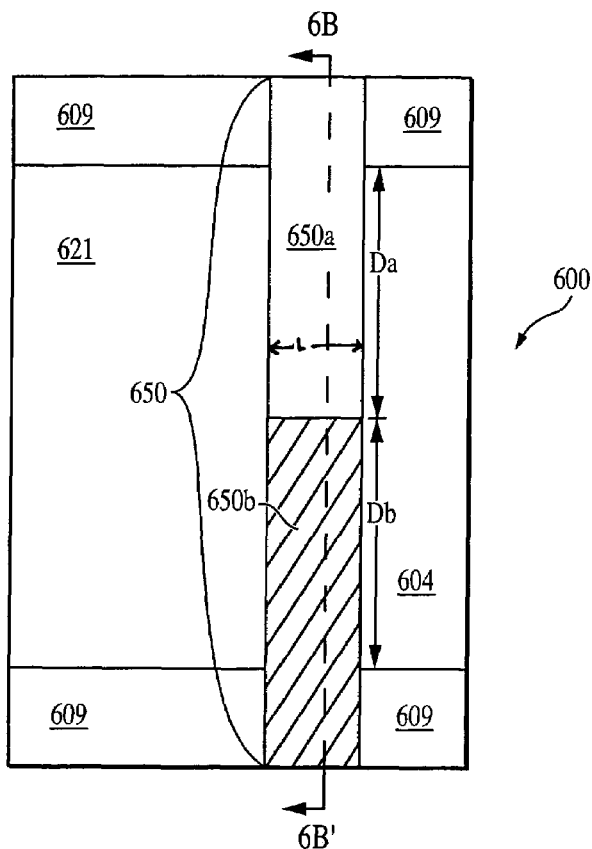
FIG. 6A is a top plan view of a portion of a pixel cell according to an embodiment of the invention.
Figure 6B:
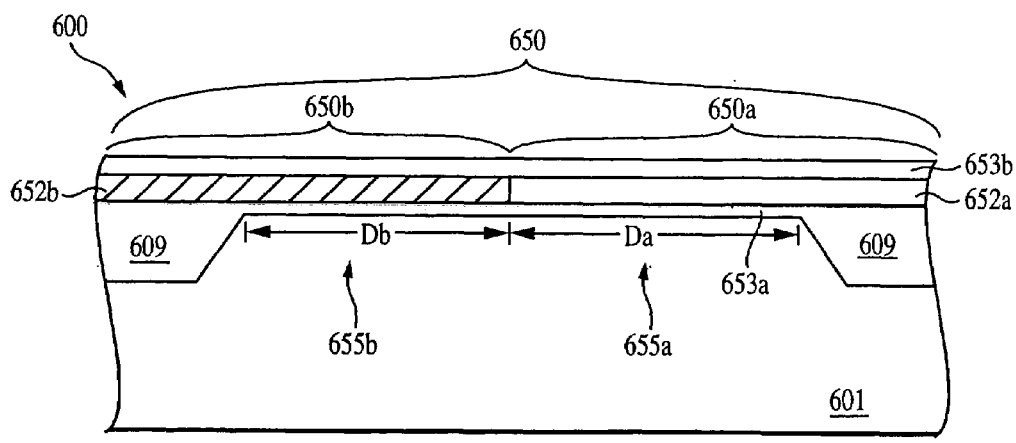
FIG. 6B depicts a cross sectional view of the pixel cell of FIG. 6A along line 6B-6B'.

FIG. 6A depicts a top plan view of a portion of a pixel cell 600 having a gate, which is illustratively a transfer gate 650, that comprises two gate regions 650a and 650b with differently tailored work-functions. FIG. 6B depicts a cross sectional view of the pixel cell 600 along line 6B-6B'. In the example of FIGS. 6A and 6B, transfer gate region 650b has a higher work-function than gate region 650b, but gate region 650a may instead have a higher work-function.

Referring to FIG. 6A, the transfer gate 650 is between a photo-conversion device, which is shown as photodiode 621, and a sensing node, which is shown as floating diffusion region 604. There are isolation regions, which are shown as STI regions 609, on opposing sides of photodiode 621 and floating diffusion region 604 and partially underlying portions of transfer gate 650. The STI regions 609 define between them an electrically active area, which, in the example of FIGS. 6A and 6B, includes the photodiode 621, the floating diffusion region 604, and the channel regions 655a, 655b (FIG. 6B).

As shown in FIG. 6B, the gate 650 has a gate oxide layer 653a over the substrate 601 and between the STI regions 609. Conductive regions, 652a and 652b are over the gate oxide layer 653a. Conductive region 652a has a lower work-function than region 652b. Accordingly, region 652a may be formed of a different material than region 652b. Also, regions 652a and 652b may be a same material with different doping characteristics to achieve different work-functions. For purposes of this specification, the term "doping characteristics" refers to the dopant used, conductivity type, and dopant concentration. Any one of, or any combination of, doping characteristics may be used to achieve different work-functions. Conductive region 652a may be an n+ polysilicon gate electrode, and region 652b may have a work-function greater than that of n+ polysilicon. Also, both regions 652a and 652b may have work-functions greater than that of n+ polysilicon. There is also an insulating layer 653b over the regions 652a and 652b.

Channel regions 655a and 655b are below and correspond to the gate regions 650a and 650b, respectively. Channel regions 655a and 655b may have same or different dopant concentrations. For example, if a same threshold voltage is desired for both gate regions 650a and 650b, channel region 655b may have a lower dopant concentration than channel region 655a.

As shown in FIGS. 6A and 6B, gate region 650a extends beyond STI 609 and over the active area by a distance $D_a$. Similarly, gate region 650b extends beyond STI 609 and over the active area by a distance $D_b$. Distances $D_a$ and $D_b$ may be equal to or different from one another. In the illustrated embodiment, each region 650a, 650b extends across approximately the entire gate length L.

The different work-functions, different channel dopant concentrations, and/or different distances, $D_a$ and $D_b$, for gate regions 650a and 650b may be used to modulate and optimize the transfer gate and its operation as desired.

Figure 7A:
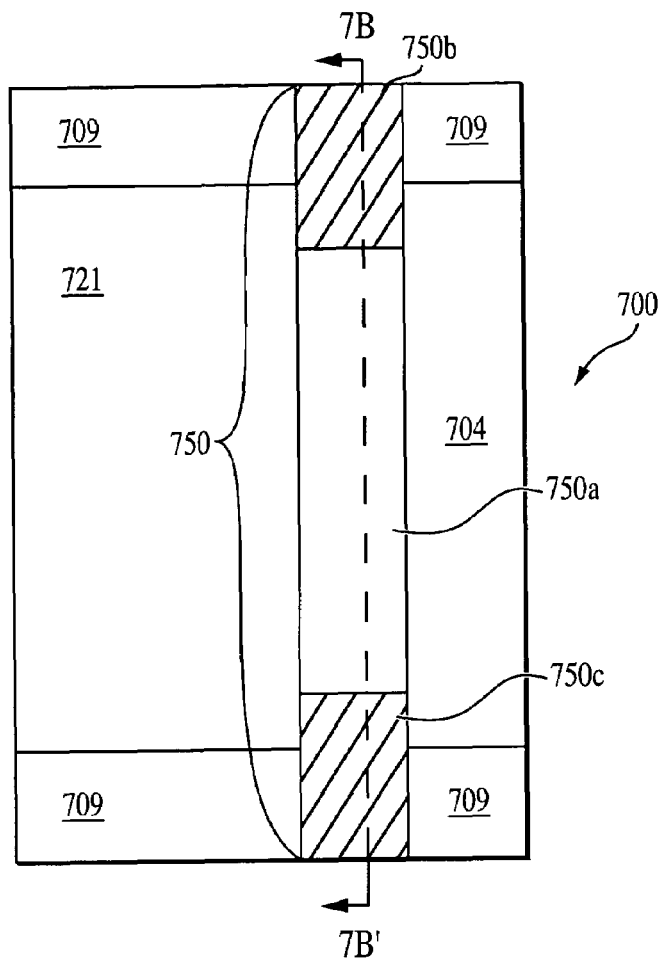
FIG. 7A is a top plan view of a portion of a pixel cell according to an embodiment of the invention.
Figure 7B:
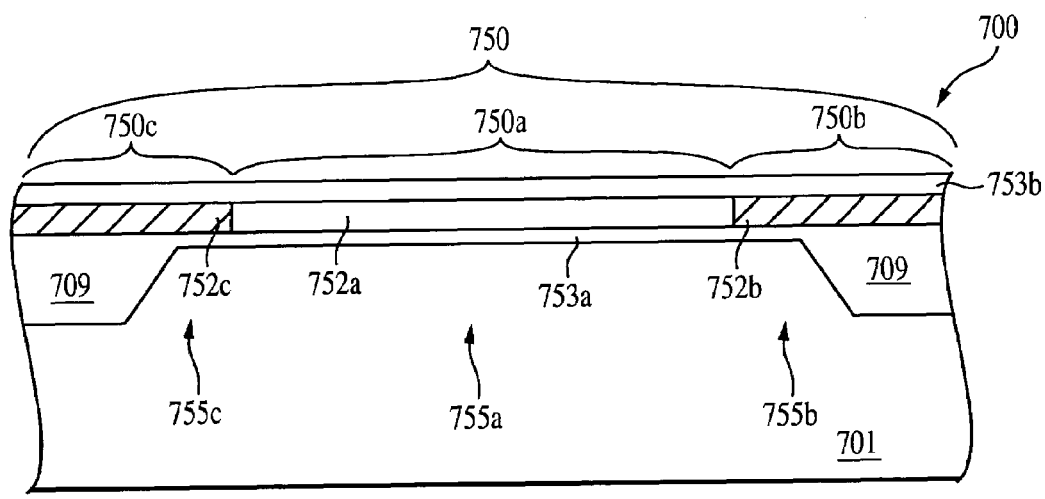
FIG. 7B depicts a cross sectional view of the pixel cell of FIG. 7A along line 7B-7B'.

FIG. 7A depicts a top plan view of a portion of a pixel cell 700 having a gate, which is illustratively a transfer gate 750, comprising three gate regions: 750a, 750b, and 750c. FIG. 7B depicts a cross sectional view of the pixel cell 700 along line 7B-7B'. The transfer gate regions 750b and 750c have higher work-functions than gate region 750a.

Referring to FIG. 7A, transfer gate 750 is between a photo-conversion device, which is illustrated as photodiode 721, and a sensing node, which is shown as floating diffusion region 704. There are isolation regions, which are illustratively STI regions 709, on opposing sides of photodiode 721 and floating diffusion region 704 and partially underlying portions of transfer gate 750. The STI regions 709 define between them an electrically active area, which, in the example of FIGS. 7A-7B, includes the photodiode 721, the floating diffusion region 704, and the channel regions 755a, 755b, 755c (FIG. 7B).

As shown in FIG. 7B, the gate 750 has a gate oxide layer 753a over a substrate 701 and between the STI regions 709. Conductive regions, 752a, 752b, and 752c are over the gate oxide layer 753a. Conductive region 752a has a lower work-function than regions 752b and 752c. Conductive regions 752b and 752c may have same or different work-functions. Accordingly, any appropriate combination of materials and/or doping characteristics may be used to achieve the desired work-functions for the regions 752a, 752b, and 752c. Conductive region 752a may be formed of n+ polysilicon, and regions 752b and 752c may have work-functions greater than that of n+ polysilicon. Also, regions 752a, 752b, and 752c may have work-functions greater than that of n+ polysilicon. There is also an insulating layer 753b over the regions 752a, 752b, and 752c.

Channel regions 755a, 755b, and 755c correspond to the gate regions 750a, 750b, and 750c, respectively. Channel region 755a has a higher dopant concentration than channel regions 755b and 755c. Channel regions 755b and 755c may have same or different dopant concentrations.

Gate regions 750b and 750c overlie the areas where photodiode 721 meets STI region 709. The area where the photodiode 721 and STI region 709 meet is typically a high leakage region due to STI stress related issues. Providing gate regions 750b and 750c having higher work-functions and reducing the dopant concentration in the channel regions 755b and 755c may control the sub-threshold leakage for the transfer transistor.

Although additional embodiments in FIGS. 6A-7B show a transfer gate device having two or three gate regions having specific configurations, the invention is not limited to specific numbers or configurations. Accordingly, a gate may also have more than three gate regions and the gate regions may have other configurations.

In any of the embodiments described above, a gate may be part of a PMOS transistor, rather than an NMOS transistor described in connection with FIGS. 4-7B above. If the gate is part of a PMOS transistor, the photodiode would be an npn-type photodiode instead of a pnp-type photodiode as described in connection with FIGS. 4-7B above, and the conductivity types of other structures would change accordingly.

While the above embodiments discuss a transfer gate, other transistor gates in a pixel cell according to the invention may be formed similarly to the transfer gate as described above in connection with FIGS. 4-7B.

Figure 8:
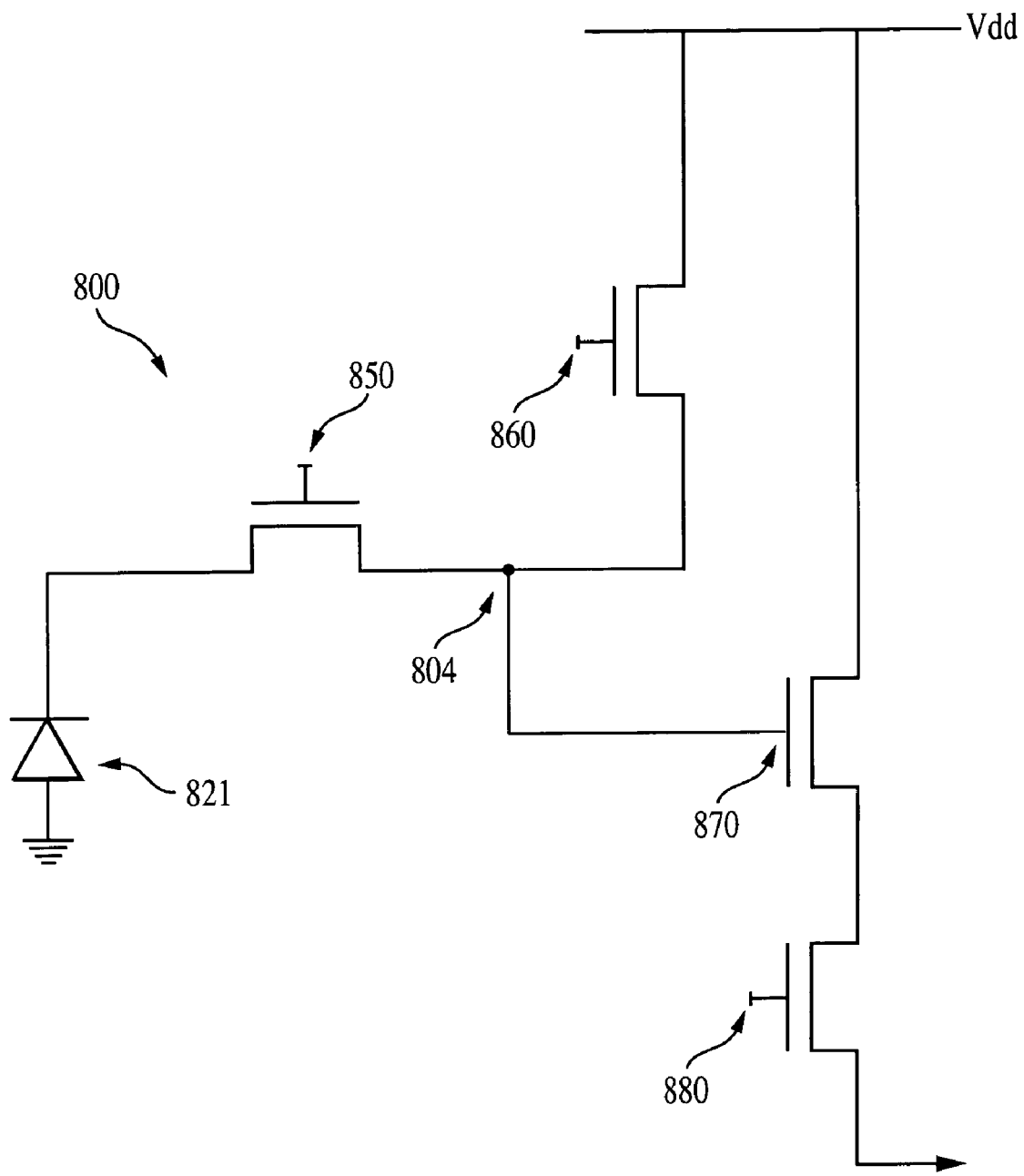
FIG. 8 is a schematic diagram of a pixel cell according to an embodiment of the invention.

Turning to FIG. 8, a schematic diagram of a pixel cell 800 is depicted according to an exemplary embodiment of the invention. The pixel cell 800 has a floating diffusion node 804 and a pinned photodiode 821, which are formed as described above in connection with FIG. 5C. There is also a transfer transistor 850 having a gate formed according to one of the embodiments described above in connection with FIGS. 4-7B.

The pixel cell 800 also comprises a source follower transistor 870, a reset transistor 860, and a row select transistor 880. Each of the transistors 860, 870, and 880 comprise at least one gate region. At least one of the reset 860 and source follower 870 transistors may have a gate formed as described above in connection with FIGS. 4-7B. The transfer 850, reset 860, and source follower 870 gates may be formed having identically tailored work-functions; or one or more of the transfer 850, reset 860, and source follower 870 gate regions may be formed having a work-function tailored differently from the others.

The work-functions of the reset 860 and source follower 870 gates may determine in part a dopant concentration in a channel region of the reset 860 and source follower 870 transistors, respectively. Alternatively, a dopant concentration in a channel region of the reset 860 and source follower 870 transistors may be a conventional dopant concentration, and the work-functions of the reset 860 and source follower 870 gates may determine a desired threshold voltage for the reset 800 and source follower 870 transistors.

In any of the embodiments described herein, where both n-type and p-type gates are desired for a single pixel cell, the transfer gate 850 and other gates formed as part of the pixel cell may be formed by a dual polysilicon process in which separate mask levels are used to form the n-type and p-type gates as known in the art.

Although the invention is described in connection with a four-transistor (4T) pixel cell, the invention may also be incorporated into other CMOS pixel cell designs having different numbers of transistors. Without being limiting, such a design may include a three-transistor (3T) cell or a five-transistor (5T) cell. A 3T cell omits the transfer transistor, but may have a reset transistor adjacent to a photodiode. A 5T cell differs from the 4T cell by the addition of a transistor, such as a shutter transistor or a CMOS photogate transistor.

Depending on the design of a pixel cell, a transfer gate may not be adjacent to a photo-conversion device. In such as case, embodiments of the invention described herein with respect to a transfer transistor may instead be applicable to a different transistor. Without being limiting, such a transistor may be, for example, a reset transistor.

Figure 9:
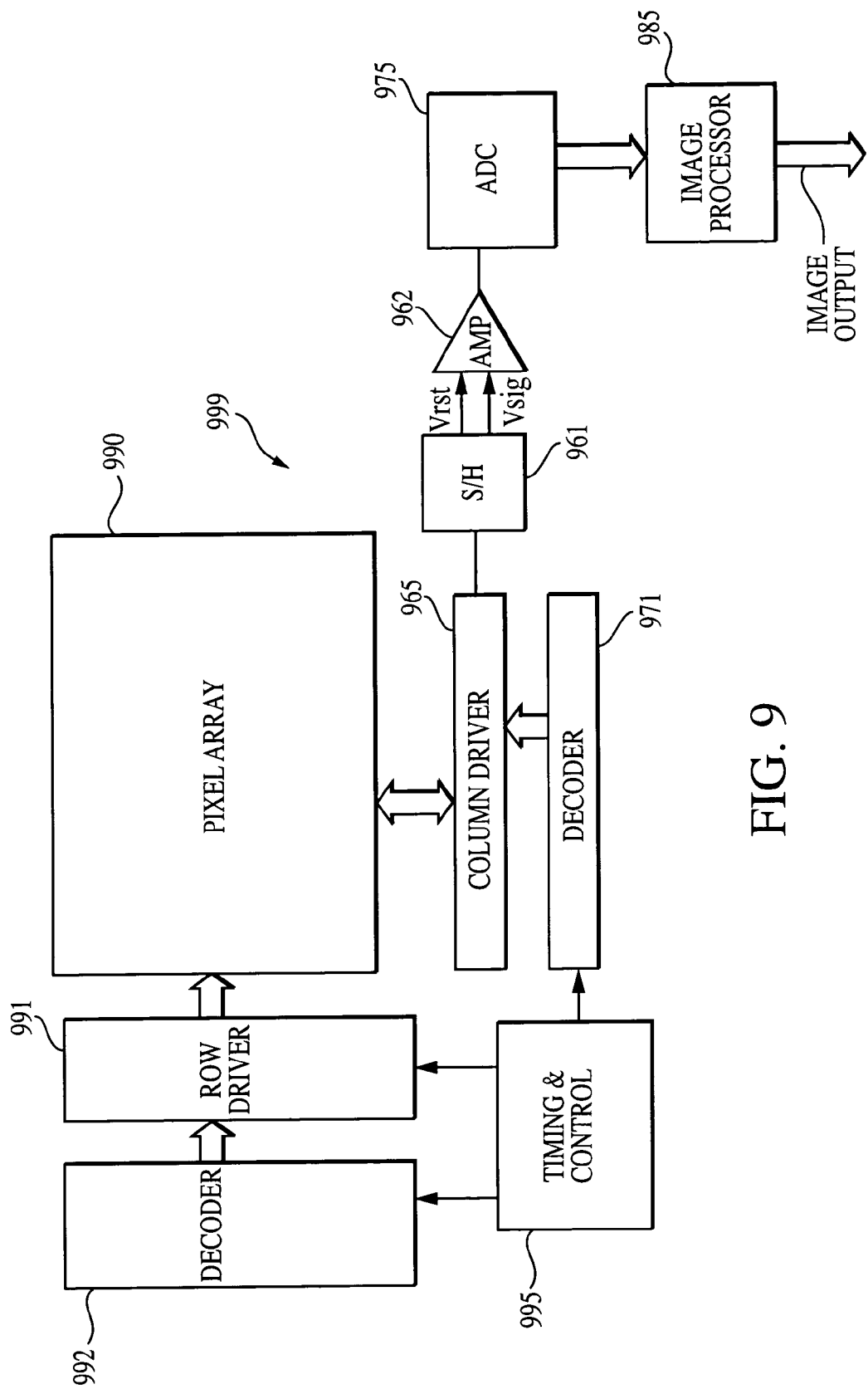
FIG. 9 is a simplified block diagram of an image sensor incorporating the pixel cell of FIG. 6.

FIG. 9 is a block diagram of an exemplary CMOS image sensor 999 according to an embodiment of the invention. The imaging device has a pixel array 990 containing a plurality of pixel cells arranged in rows and columns. One or more of the pixel cells in the array 990 is a pixel cell 800 as described above in connection with FIG. 8.

The image sensor 999 operates as is known in the art. Accordingly, the pixels of each row in array 990 are all turned on at the same time by a row select line, and the pixels of each column are selectively output by respective column select lines. The row lines are selectively activated by a row driver 991 in response to row address decoder 992. The column select lines are selectively activated by a column driver 965 in response to column address decoder 971. The pixel array is operated by the timing and control circuit 995, which controls address decoders 992, 971 for selecting the appropriate row and column lines for pixel signal readout. The pixel column signals, which typically include a pixel reset signal ($V_{rst}$) and a pixel image signal ($V_{sig}$), are read by a sample and hold circuit (S/H) 961 associated with the column driver 965. A differential signal ($V_{rst}$–$V_{sig}$) is produced by differential amplifier (AMP) 962 for each pixel which is amplified and digitized by analog to digital converter (ADC) 975. The analog to digital converter 975 supplies the digitized pixel signals to an image processor 985 which forms a digital image.

Although the invention is described in connection with a CMOS image sensor, the invention is also applicable to analogous structures of a charge coupled device (CCD) image sensor.

Figure 10:
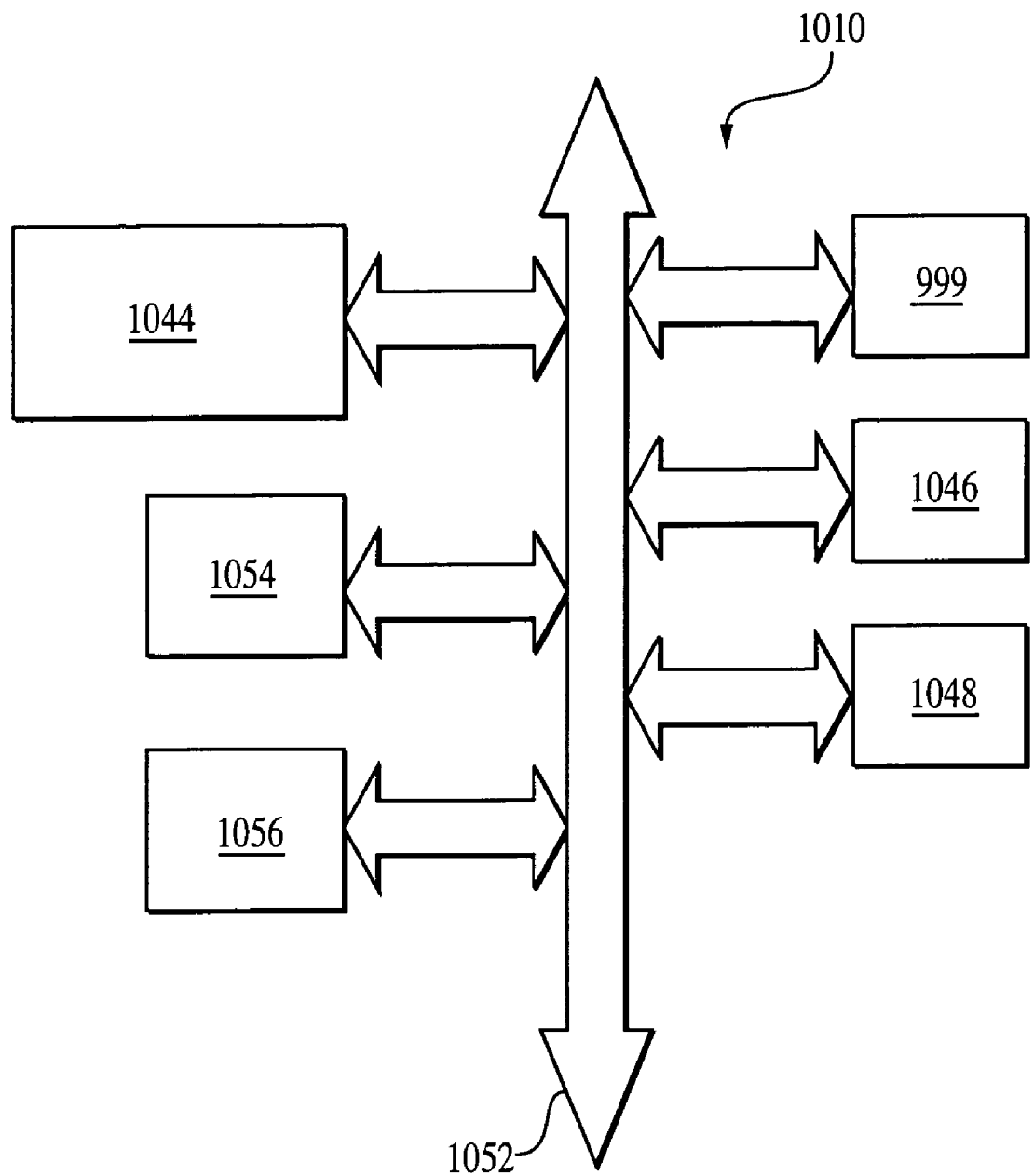
FIG. 10 illustrates a simplified block diagram of a computer processor system incorporating the FIG. 9 image sensor.

A typical processor-based system 1010, which includes the CMOS image sensor device 999 above, is illustrated generally in FIG. 10. A processor-based system 1010 is exemplary of a system having digital circuits that could include CMOS image sensor devices. Without being limiting, such a system could include a computer system, camera system, scanner, machine vision, vehicle navigation, video phone, surveillance system, auto focus system, star tracker system, motion detection system, image stabilization system, and data compression system.

A processor-based system, for example a computer system, generally comprises a central processing unit (CPU) 1044, such as a microprocessor, that communicates with an input/output (I/O) device 1046 over a bus 1052. The CMOS image sensor 999, which produces an image output from a pixel array, also communicates with the CPU 1044 over bus 1052. The processor-based system 1010 also includes random access memory (RAM) 1048, and may include peripheral devices, such as a floppy disk drive 1054 and a compact disk (CD) ROM drive 1056, which also communicate with CPU 1044 over the bus 1052. The CMOS image sensor 999 may be combined with a processor, such as a CPU, digital signal processor, or microprocessor, with or without memory storage on a single integrated circuit or on a different chip than the processor.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention.

The invention claimed is:

1. A pixel cell comprising:
   a photo-conversion device;
   a sensing node; and
   a first transistor for gating charge from said photo-conversion device to said sensing node; said first transistor comprising a gate electrode having a length and a channel region under said gate electrode,
   said length of said gate electrode extending from said photo-conversion device to said sensing node, said length of said gate electrode being divided into a plurality of gate electrode regions, each gate electrode region extending from said photo-conversion device to said sensing node, wherein at least one said gate electrode region has a work-function greater than a work-function of n+ Si, and another said gate electrode region has a different work-function from that of said at least one gate electrode region, said channel region comprising respective portions below each gate electrode region, wherein a doping concentration of at least one portion of said channel region is determined in part by the work-function of the respective gate electrode region.

2. The pixel cell of claim 1, wherein the first transistor is a transfer transistor for transferring photo-generated charge from the photo-conversion device to a floating diffusion region.

3. The pixel cell of claim 1, wherein at least one gate electrode region comprises a mid-gap material.

4. The pixel cell of claim 3, wherein the mid-gap material is selected from the group consisting of: $Si_{1-x}Ge_x$, TiN/W, Al/TiN, Ti/TiN, and TaSiN.

5. The pixel cell of claim 3, wherein the mid-gap material is $Si_{1-x}Ge_x$ and wherein the mole fraction of Ge in the $Si_{1-x}Ge_x$ is approximately 0.4.

6. The pixel cell of claim 5, wherein the at least one gate electrode region is doped to one of a first or second conductivity type.

7. The pixel cell of claim 1, wherein at least one gate electrode region comprises a degenerately doped p+ polysilicon layer.

8. The pixel cell of claim 1, wherein at least one gate electrode region comprises a layer of lower doped polysilicon of a first or second conductivity type.

9. The pixel cell of claim 8, wherein at least one gate electrode region has a dopant profile allowing for at least partial depletion of the at least one gate electrode region.

10. The pixel cell of claim 8, wherein the dopant is indium.

11. The pixel cell of claim 1, wherein there is approximately no active dopant in at least one portion of the channel region.

12. The pixel cell of claim 1, further comprising:
a second transistor formed adjacent said sensing node, wherein the second transistor comprises a gate electrode, the gate electrode comprising at least one gate electrode region having a work-function greater than a work-function of n+ Si.

13. The pixel cell of claim 12, wherein at least one second transistor gate electrode region is formed of a same material as the at least one gate electrode region.

14. The pixel cell of claim 1, wherein the at least one said gate electrode region is a first gate electrode region and the another said gate electrode region is a second gate electrode region and the first transistor comprises first and second channel portions under the first and second gate electrode regions, respectively.

15. The pixel cell of claim 14, wherein each of the first and second gate electrode regions extends over an active area by a different distance.

16. The pixel cell of claim 14, wherein the first and second gate electrode regions have different work-functions, and wherein each work-function is greater than a work-function of n+ Si.

17. The pixel cell of claim 14, wherein the first and second gate electrode regions comprise a same material having different doping characteristics.

18. The pixel cell of claim 1, wherein the at least one said gate electrode region is a first gate electrode region and the another said gate electrode region is a second gate electrode region and the first transistor comprises a third gate electrode region extending from said photo-conversion device to said sensing node and first, second, and third channel portions under the first, second, and third gate electrode regions, respectively.

19. The pixel cell of claim 18, wherein the first gate electrode region is between the second and third gate electrode regions, and wherein the second and third gate electrode regions are each over a respective area where an isolation region and an active region meet, and wherein at least one of the second and third gate electrode regions has a work-function greater than a work-function of n+ Si.

20. The pixel cell of claim 19, wherein the second and third gate electrode regions have a same work-function.

21. The pixel cell of claim 19, wherein the doping concentration of at least one of the second and third channel portions is determined at least in part by the work-function of the respective gate electrode region.

22. The pixel cell of claim 19, wherein the first gate electrode region is formed of a different material than the second and third gate electrode regions.

23. The pixel cell of claim 19, wherein the first, second, and third gate electrode regions are formed of a same material having different doping characteristics.

24. A pixel cell comprising: a photo-conversion device at a surface of a substrate; and a transistor formed over a substrate and adjacent to the photo-conversion device, the transistor comprising a gate electrode overlying a channel region, the gate electrode having a length extending from a source/drain region to the photo-conversion device and the gate electrode comprising at least two gate electrode regions, each gate electrode region extending the length of the gate electrode and having a substantially uniform dopant type and concentration, wherein at least one of the gate electrode regions has a work-function greater than a work-function of n+ Si, the channel region comprising respective portions below each gate electrode region.

25. The pixel cell of claim 24, wherein each gate electrode region extends over an active area by a different distance.

26. A pixel cell comprising:
a photo-conversion device at a surface of a substrate; and
a transistor formed over a substrate and adjacent to the photo-conversion device, the transistor comprising a gate electrode overlying a channel region and having a length extending from a source/drain region to the photo-conversion device, the gate electrode comprising first, second, and third gate electrode regions and each gate electrode region extending the length of the gate electrode, wherein the first gate electrode region is between the second and third gate electrode regions, and wherein the second and third gate electrode regions are over an area where an isolation region and an active region meet, and wherein at least one of the second and third gate electrode regions has a work-function greater than a work-function of n+ Si, the channel region comprising first, second, and third portions below each gate electrode region, respectively.

27. The pixel cell of claim 26, wherein the second and third gate electrode regions have a same work-function.

28. The pixel cell of claim 26, wherein a doping concentration of at least one of the second and third channel portions is determined at least in part by the work-function of the respective gate electrode region.

29. An image sensor, comprising:
an array of pixel cells, wherein each pixel cell comprises:
a photo-conversion device,
a floating diffusion region, and
a transistor for gating charge from said photo-conversion device to said floating diffusion region, said transistor comprising a gate electrode having a length and a channel region under said gate electrode,
said length of said gate electrode extending from said photo-conversion device to said floating diffusion region,
said length of said gate electrode being divided into a plurality of gate electrode regions, each gate electrode region extending from said photo-conversion device to said floating diffusion region, wherein at least one said gate electrode region has a work-function greater than a work-function of n+ Si, and another said gate electrode region has a different work-function from that of said at least one gate electrode region, said channel region comprising respective portions below each gate electrode region, wherein a doping concentration of at least one portion of said channel region is determined in part by the work-function of the respective gate electrode region.

30. The image sensor of claim 29, wherein the image sensor is a CMOS image sensor.

31. The image sensor of claim 29, wherein the image sensor is a charge coupled device image sensor.

32. The image sensor of claim 29, wherein the transistor is a transfer transistor.

33. The image sensor of claim 29, wherein at least one gate electrode region comprises a mid-gap material.

34. The image sensor of claim 33, wherein the mid-gap material is selected from the group consisting of: $Si_{1-x}Ge_x$, TiN/W, Al/TiN, TiFFiN, and TaSiN.

35. The image sensor of claim 34, wherein the mid-gap material is $Si_{1-x}Ge_x$, and wherein the mole fraction of Ge in $Si_{1-x}Ge_x$ is approximately 0.4.

36. The image sensor of claim 35, wherein the least one gate electrode region is doped to one of a first or second conductivity type.

37. The image sensor of claim 29, wherein at least one gate electrode region comprises a degenerately doped p+ polysilicon layer.

38. The image sensor of claim 29, wherein at least one gate electrode region comprises a layer of lower doped polysilicon of a first or second conductivity type.

39. The image sensor of claim 38, wherein the at least one gate electrode region has a dopant profile allowing for at least partial depletion of the at least one gate electrode region.

40. The image sensor of claim 29, wherein there is approximately no active dopant in at least one portion of the channel region.

41. The image sensor of claim 29, wherein the at least one said gate electrode region is a first gate electrode region and the another said gate electrode region is a second gate electrode region and the transistor comprises first and second channel portions below the first and second gate electrode regions, respectively.

42. The image sensor of claim 41, wherein the first and second gate electrode regions each extend over an active area by a different distance.

43. The image sensor of claim 41, wherein the first and second gate electrode regions have different work-functions, and wherein each work-function is greater than a work-function of n+ Si.

44. The image sensor of claim 29, wherein the at least one said gate electrode region is a first gate electrode region and the another said gate electrode region is a second gate electrode region and the first transistor comprises a third gate electrode region extending from said photo-conversion device to said floating diffusion region and first, second, and third channel portions below the first, second, and third gate electrode regions, respectively.

45. The image sensor of claim 44, wherein the first gate electrode region is between the second and third gate electrode regions, and wherein the second and third gate electrode regions are each over a respective area where an isolation region and an active region meet, and wherein at least one of the second and third gate electrode regions has a work-function greater than a work-function of n+ Si.

46. The image sensor of claim 45, wherein the second and third gate electrode regions have a same work-function.

47. The image sensor of claim 45, wherein the doping concentration of at least one of the second and third channel portions is determined at least in part by the work-function of the respective gate electrode region.

48. A processor system, comprising:
(i) a processor; and
(ii) an image sensor coupled to the processor, the image sensor comprising:
a pixel comprising:
a photo-conversion device,
a sensing node, and
a transistor for gating charge from said photo-conversion device to said sensing node, said transistor comprising a gate electrode having a length and a channel region under said gate electrode,
said length of said gate electrode extending from said photo-conversion device to said sensing node,
the length of said gate electrode being divided into two gate electrode regions, each gate electrode region extending from said photo-conversion device to said sensing node, wherein one said gate electrode region has a work-function greater than a work-function of n+ Si, and another said gate electrode region has a different work-function from that of said one gate electrode region, said channel region comprising respective portions below each gate electrode region, wherein a doping concentration of at least one portion of said channel region is determined in part by the work-function of the respective gate electrode region.

49. The system of claim 48, wherein the image sensor is a CMOS image sensor.

50. The system of claim 48, wherein the image sensor is a charge coupled device image sensor.

51. A method of forming a pixel cell, the method comprising:
forming a photo-conversion device;
forming a sensing node; and
forming a first transistor for gating charge from said photo-conversion device to said sensing node; the act of forming said first transistor comprising forming a gate electrode having a length and forming a channel region under said gate electrode,
said length of said gate electrode extending from said photo-conversion device to said sensing node,
said length of said gate electrode being divided into a plurality of gate electrode regions, each gate electrode region extending from said photo-conversion device to said sensing node, wherein at least one said gate electrode region has a work-function greater than a work-function of n+ Si, and another said gate electrode region has a different work-function from that of said at least one gate electrode region, the act of forming said channel region comprising forming at least one channel portion under said at least one gate electrode region.

52. The method of claim 51, wherein the act of forming the first transistor comprises forming a transfer transistor for transferring photo-generated charge from the photo-conversion device to a floating diffusion region.

53. The method of claim 51, wherein at least one gate electrode region comprises forming a layer of mid-gap material.

54. The method of claim 53, wherein the act of forming the layer of mid-gap material comprises forming the layer of mid-gap material selected from the group consisting of: $Si_{1-x}Ge_x$, TiN/W, Al/TiN, Ti/TiN, and TaSiN.

55. The method of claim 54, wherein the act of forming a layer of mid-gap material comprises forming a layer of $Si_{1-x}Ge_x$, wherein a mole fraction of Ge is approximately 0.4.

56. The method of claim 55, wherein the act of forming a layer of $Si_{1-x}Ge_x$ comprises doping the layer of $Si_{1-x}Ge_x$ to one of a first or second conductivity type.

57. The method of claim 51, wherein at least one gate electrode region comprises forming a layer of degenerately doped p+ polysilicon.

58. The method of claim 51, wherein at least one gate electrode region comprises forming a layer of lower doped polysilicon of a first or second conductivity type.

59. The method of claim 58, wherein the act of forming the layer of lower doped polysilicon comprises forming the layer of lower doped polysilicon having a dopant profile allowing for at least partial depletion of the at least one gate electrode region.

60. The method of claim 59, wherein the act of forming the layer of lower doped polysilicon comprises doping the polysilicon with indium.

61. The method of claim 51, wherein forming the channel region comprises forming at least one portion of the channel region having approximately no active dopant concentration.

62. The method of claim 51, wherein the act of forming the gate electrode comprises forming the at least one said gate electrode region as a first gate electrode region and forming the another said gate electrode region as a second gate electrode region, and wherein the act of forming the channel region comprises forming first and second channel portions below the first and second gate electrode regions, respectively.

63. The method of claim 62, wherein the act of forming the first and second gate electrode regions comprises forming the first and second gate electrode regions such that each of the first and second gate electrode regions extends over an active area by a different distance.

64. The method of claim 62, wherein the first and second gate electrode regions are each formed having different work-functions, each work-function being greater than a work-function of n+ Si.

65. The method of claim 51, wherein the at least one said gate electrode region is a first gate electrode region and the another said gate electrode region is a second gate electrode region and the act of forming the gate electrode comprises forming a third gate electrode region, and wherein the act of forming the channel region comprises forming first, second, and third channel portions below the first, second, and third gate electrode regions, respectively.

66. The method of claim 65, wherein the first gate electrode region is formed between the second and third gate electrode regions, and wherein the second and third gate electrode regions are each formed over a respective area where an isolation region and an active region meet, and wherein at least one of the second and third gate electrode regions has a work-function greater than a work-function of n+ Si.

67. The method of claim 66, wherein the second and third gate electrode regions are formed having a same work-function.

68. The method of claim 66, wherein the act of forming the second and third channel portions comprises forming the second and third channel portions such that a doping concentration of at least one of the second and third channel portions is determined at least in part by the work-function of the respective gate electrode region.

69. The method of claim 51, further comprising:
forming a second transistor, the act of forming the second transistor comprising forming at least one second transistor gate electrode region having a work-function greater than a work-function of n+ Si.

70. The method of claim 69, wherein the at least one second transistor gate electrode region is formed of the same material as the at least one gate electrode region.

71. A method of forming a pixel cell, the method comprising:
forming a photo-conversion device; and
forming a transistor adjacent to the photo-conversion device, the act of forming the transistor comprising forming a gate electrode overlying a channel region, the act of forming the gate electrode comprising forming a gate electrode having a length extending from a source/drain region to the photo-conversion device, the gate electrode comprising at least two gate electrode regions, each gate electrode region extending the length of the gate electrode and having a substantially uniform dopant type and concentration, wherein at least one of the gate electrode regions has a work-function greater than a work-function of n+ Si, the act of forming the channel region comprising forming respective portions below each gate electrode region.

72. The method of claim 71, wherein the act of forming the at least two gate electrode regions comprises forming each of the gate electrode regions extending over an active area by a different distance.

73. A method of forming a pixel cell, the method comprising:
forming a photo-conversion device at a surface of a substrate; and
forming a transistor adjacent to the photo-conversion device, the act of forming the transistor comprising forming a gate electrode overlying a channel region, the act of forming the gate electrode comprising forming a gate electrode having a length extending from a source/drain region to the photo-conversion device, and forming first, second, and third gate electrode regions, each gate electrode region extending the length of the gate electrode and wherein the first gate electrode region is formed between the second and third gate electrode regions, and wherein the second and third gate electrode regions are each formed over a respective area where an isolation region and active region meet, and wherein at least one of the second and third gate electrode regions is formed having a work-function greater than a work-function of n+ Si, the act of forming the channel region comprising forming first, second, and third portions below the first, second, and third gate electrode, regions, respectively.

74. The method of claim 73, wherein the second and third gate electrode regions are formed having a same work-function.

75. The method of claim 73, wherein the doping concentration of at least one of the second and third channel portions is determined at least in part by the work-function of the respective gate electrode region.

* * * * *

UNITED STATES PATENT AND TRADEMARK OFFICE
CERTIFICATE OF CORRECTION

PATENT NO. : 7,335,958 B2 Page 1 of 1
APPLICATION NO. : 10/602716
DATED : February 26, 2008
INVENTOR(S) : Mouli It is certified that error appears in the above-identified patent and that said Letters Patent is hereby corrected as shown below:

On the Title page, in field (56), under "Other Publications", in column 2, line 2, delete "um" and insert -- µm --, therefor.

In column 15, line 34, in Claim 34, delete "TifFiN," and insert -- Ti/TiN, --, therefor.

Signed and Sealed this

Tenth Day of June, 2008

JON W. DUDAS
*Director of the United States Patent and Trademark Office*